United States Patent
Jurgensen et al.

(10) Patent No.: US 6,211,051 B1
(45) Date of Patent: Apr. 3, 2001

(54) REDUCTION OF PLASMA DAMAGE AT CONTACT ETCH IN MOS INTEGRATED CIRCUITS

(75) Inventors: Charles W. Jurgensen; Kang-Jay Hsia, both of Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/292,079

(22) Filed: Apr. 14, 1999

(51) Int. Cl.[7] .................. H01L 21/3065; H01L 21/27
(52) U.S. Cl. .................. 438/597; 438/720; 438/669; 438/926
(58) Field of Search .................. 438/597, 720, 438/669, 926, 241, 238, 233, 200, 210; 257/382, 740, 313; 430/325, 296, 311

(56) References Cited

U.S. PATENT DOCUMENTS

| | | | |
|---|---|---|---|
| 4,291,322 | * 9/1981 | Clemens et al. | 257/382 |
| 4,623,609 | * 11/1986 | Harita et al. | 430/325 |
| 5,310,453 | 5/1994 | Fukasawa et al. | 156/643 |
| 5,350,710 | 9/1994 | Hong et al. | 437/170 |
| 5,650,651 | 7/1997 | Bui | 257/355 |
| 5,728,259 | 3/1998 | Suzawa et al. | 156/646.1 |
| 5,760,445 | 6/1998 | Diaz | 257/356 |
| 5,866,451 | * 2/1999 | Yoo et al. | 438/241 |
| 5,866,482 | * 2/1999 | Lee | 438/720 |

OTHER PUBLICATIONS

On the Link Between Shadowing and Charging Damage; Gyeong S. Hwang et al.; 1997 2nd International Symposium on Plasma Process–Induced Damage; May 13–14, 1997; pp. 63–66.

Topographic Dependence of Plasma Charging Induced Device Damage; Vahid Vahedi et al.; 1997 2nd International Symposium on Plasma Process–Induced Damage; May 13–14, 1997; pp. 41–44.

* cited by examiner

*Primary Examiner*—Matthew Smith
*Assistant Examiner*—Igwe U. Anya

(57) ABSTRACT

A method of fabricating contacts to device elements of an integrated circuit on a semiconductor substrate that includes: (a) using a plasma process to form a first hole in the material above a first portion of the device, wherein the first hole has a depth and a width at the end of the plasma process, and wherein the first hole has an aspect ratio at the end of the plasma process defined by its depth divided by its width; (b) using a plasma process to form a second hole in the material above a second portion of the device, adjacent to the first portion, wherein the second hole has a depth and a width at the end of the plasma process, and wherein the second hole has an aspect ratio at the end of the plasma process defined by its depth divided by its width; and (c) wherein the aspect ratio of the first hole is substantially equivalent to the aspect ratio of the second hole.

17 Claims, 3 Drawing Sheets

REDUCTION OF PLASMA DAMAGE AT CONTACT ETCH IN MOS INTEGRATED CIRCUITS

BACKGROUND

The present invention relates generally to the fabrication of integrated circuits (ICs) and, in particular, to techniques for fabricating ICs such that the ICs suffer a reduced amount of plasma induced damage during plasma processing steps.

Integrated circuits that incorporate active elements such as metal-oxide-semiconductor (MOS) are fabricated from semiconductor wafers by using multiple steps to grow and deposit materials used in the integrated circuit. Such steps may include wafer fabrication, growth of oxide layers through thermal oxidation, ion implantation, doping, deposition of various insulating, conducting and semiconducting materials, deposition of various types photoresists, and lithography. One process used to deposit materials is chemical vapor deposition (CVD) in which a vapor is flowed over the surface on which a layer of material is to be deposited under conditions such that the vapor reacts with the surface to deposit the desired layer. The efficiency of CVD can be enhanced by flowing the vapor in the presence of a plasma that is used to create ions and radicals that recombine to deposit the desired layer on the surface. This technique is known as plasma enhanced CVD or PECVD.

In the process of preparing an IC, materials may be selectively removed from the IC at various times during its preparation. Techniques used to remove materials from the IC include wet etching, such as chemical etching or electrochemical etching, and dry etching, such as reactive ion etching (RIE) or other plasma etching techniques. During RIE a plasma is created and a voltage bias is created to direct ions from the plasma into the surface to be etched.

During IC fabrication, plasma processing may be used, for example, to selectively remove material from the surface of an IC in order to create a pattern of contact holes on the surface of the IC. The contact holes are filled, during later processing steps, with conductive material to establish contacts to the source, gate, and drain of the transistors on the IC. Generally, polysilicon (or titanium silicide, cobalt silicide, or platinum silicide over polysilicon) lies at the bottom of a contact hole used to make a contact to the gate of a transistor (gate contacts), and active silicon (or titanium silicide cobalt silicide, or platinum silicide over active silicon) lies at the bottom of a contact hole used to make a contact to a source or drain of a transistor (active contacts). Plasma processing is used to remove pre-metal dielectric material over the polysilicon gate contacts and the active silicon active contacts so that contacts may be established to the gate, source and drain of transistors on the IC.

During plasma processing, a plasma is created by ionizing a gas with a radio-frequency (RF) electromagnetic field. In typical plasma processes used in the semiconductor industry, the wafer on which the IC is created is backed by a blocking capacitor, such that direct current (DC) cannot pass through the wafer. Thus, the time average (over one RF cycle) electron flux to the wafer must match the time average ion flux to the wafer. Plasma physics requires, however, that the ions impacting the surface are highly directional, while the electrons are much less directional, and form a nearly isotropic cloud.

If an insulating surface, for example, photoresist or oxide, that is exposed to the plasma is not flat and smooth the ion and electron angular distributions are shadowed differently by the topology of the surface. In the case of contact holes, ions penetrate more effectively to the bottom of the contact holes and cause a positive potential to build up there. The resulting potential scales with the aspect ratio (depth divided by width) of the topology and with plasma parameters (for example, electron and ion angular and energy distributions) and can reach tens to hundreds of volts.

When contact holes are etched in an IC so that contacts can be made to the gate, source and drain of the transistors, the depth of the contact holes above active silicon (active contacts) are generally deeper than those to transistor gates (gate contacts). Thus, if the width of the gate and active contacts are equal, different potentials will be imposed upon these different circuit elements. Since gates and active circuit elements are connected by conducting materials except for a small thickness of insulating material, e.g. the thickness of the gate oxide, a strong electric field through the insulating material may result from the potential difference present during plasma processing at the bottoms of neighboring contact holes (i.e., active and gate contacts to the same transistor separated by the thickness of the gate oxide). This electric field may be strong enough to cause dielectric breakdown wherein the dielectric or insulating material becomes conducting. Dielectric breakdown may destroy the transistor or capacitor. In less extreme cases, the potential difference may cause Fowler-Nordheim tunneling of a current through the insulating material, which may cause bond rupture, the generation of defects such as vacancies, and interstitials, and other damage to the insulating material through which the current tunnels. The size of the damaged region may be comparable to the thickness of the gate oxide. Some of these defects are electrically charged and this may undesirably change the threshold voltage of the transistors.

After all plasma processing operations have been completed, an anneal containing hydrogen or deuterium containing is typically used to neutralize charged defects as much as possible. Nevertheless, the resulting hydrogen or deuterium passivated defect can be re-ionized by hot electron stressing. Thus, the damage to the IC may not be immediately apparent just subsequent to fabrication, but may appear only later during use, or in hot electron reliability studies of the IC.

Damage due to plasma processing according to the processes described above can also occur when neighboring contact holes are simultaneously etched to two plates of a capacitor structure and the contact holes have different depths and an identical width. In this case the potential difference is imposed across the capacitor dielectric. Dielectric breakdown of the capacitor dielectric can destroy the capacitor.

Damage due to the above described processes may occur during many different kinds of plasma processes, for example, plasma etching, reactive ion etching (RIE), magnetically enhanced reactive ion etching (MERIE), reactive sputter etching (RSE), high density plasma etching (HDP RIE), electron cyclotron resonance plasma etching (ECR RIE), helicon plasma etching, transformer coupled plasma etching (TCP RIE), inductively coupled plasma etching, decoupled plasma source reactive ion etching (DPS RIE) and reactive ion beam etching (RIBE). The common feature of these anisotropic etching processes (including the ion beam case where the beam itself is a quasi-neutral plasma whose electrons are usually supplied by an electron emission source near the beam) is that the positive ions are highly directional while the neutralizing flux of electrons is much less directional.

Although various techniques have been employed to repair plasma induced damage to the insulating material of the gate oxide portion of an IC a fabrication process that reduces or eliminates damage during the plasma processing stages is desirable.

SUMMARY

In one aspect, the invention features a method of fabricating contacts to device elements of an integrated circuit on a semiconductor substrate. The method of the invention features using a plasma process to form a first hole in the material above a first portion of the device, wherein the first hole has a depth and a width at the end of the plasma process, and wherein the first hole has an aspect ratio at the end of the plasma process defined by its depth divided by its width. Furthermore, a plasma process is used to form a second hole in the material above a second portion of the device, adjacent to the first portion, wherein the second hole has a depth and a width at the end of the plasma process, and wherein the second hole has an aspect ratio at the end of the plasma process defined by its depth divided by its width. According to the invention, the width of the holes is adjusted such that the aspect ratio of the first hole is substantially equivalent to the aspect ratio of the second hole.

Features of the invention may include one or more of the following features. A first portion of the device may be the gate of a transistor, and may consist of polysilicon. The material above the first portion of the device may consist of photoresist and/or a dielectric material. The second portion of the device may be the source or the drain of a transistor and may consist of active silicon. The material above the second portion of the device may consist of photoresist and/or a dielectric material. The plasma process used in the method of the invention may be plasma etching. The material above the first portion of the device and the material above the second portion of the device may be planarized prior to the start of the plasma process. The plasma process may be terminated after polysilicon is exposed at the bottom of the first hole and active silicon is exposed at the bottom of the second hole.

Other features of the invention may include determining the width of the first hole and the width of the second hole by a lithographic pattern in a photoresist layer on the integrated circuit. The lithographic pattern may be transferred to the photoresist by a pattern generating mask and the pattern generating mask may be a photolithography mask an X-ray lithography mask or a projection electron-beam lithography mask. The differently sized features of the pattern generating mask corresponding to the widths of the first and second holes may be created by using Boolean logic to combine circuit element design patterns with circuit design patterns.

Advantages of the invention include using plasma processing in the fabrication of ICs that are more reliable and have higher fabrication yields than ICs made with current processing techniques. Other features and advantages will be apparent from the following detailed description, the drawings, and the claims.

DETAILED DESCRIPTION

Figure 1:
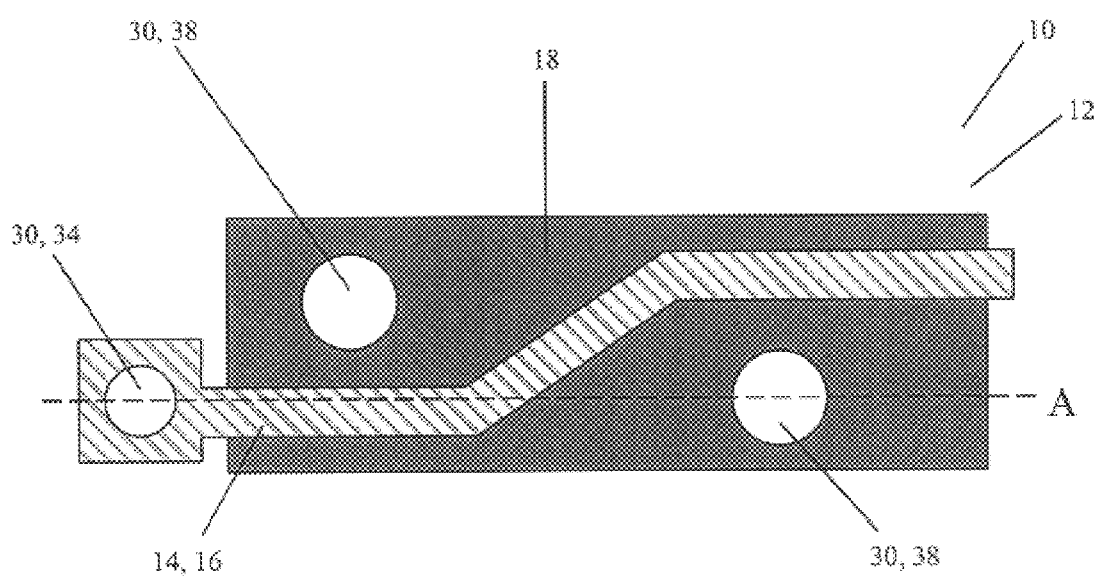
FIG. 1 is a top down view of a typical transistor showing active silicon, the polysilicon gate, the contacts to active silicon and to the polysilicon gate, and the lines of the cross-sections in FIGS. 2 and 3.

Referring to FIG. 1, an exemplary partially-fabricated integrated circuit (IC) 10 includes a portion of a MOS field effect transistor (MOSFET) 12. A polysilicon line 14, is used to form the gate 16 of the MOSFET 12, and active silicon 18 that has been doped with certain impurities forms what can function as either the source or drain of the MOSFET.

Figure 2:
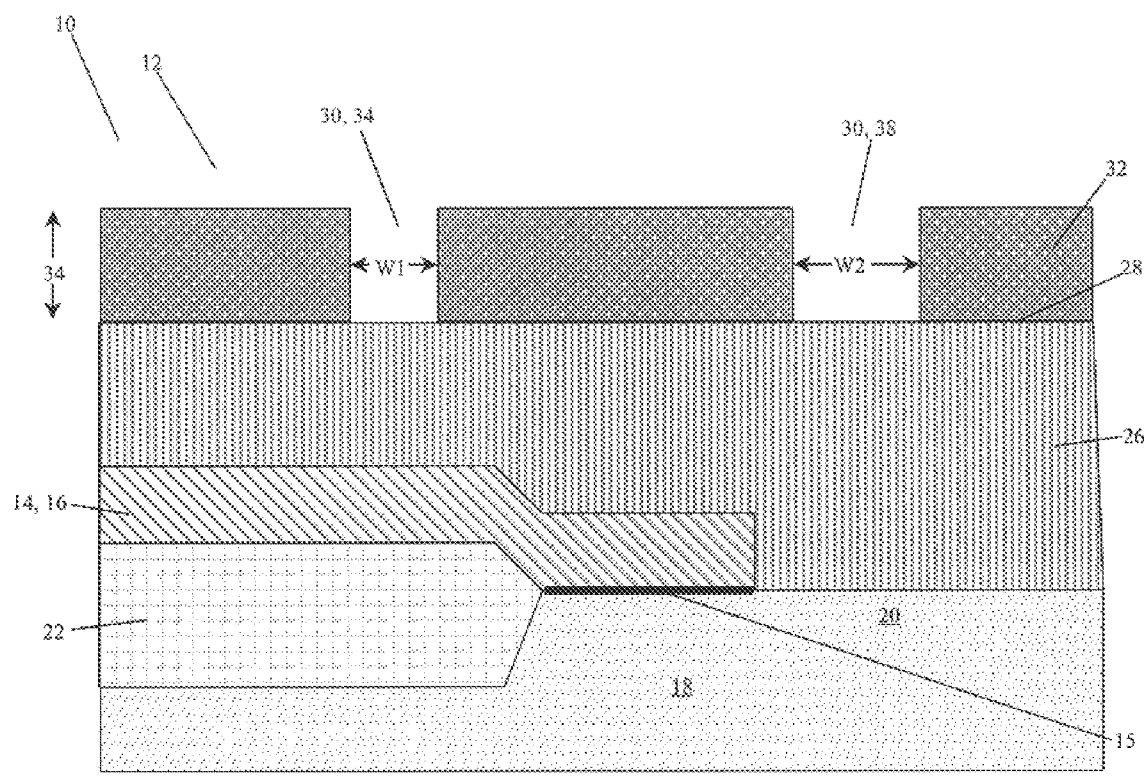
FIG. 2 is a cross-sectional view of the integrated circuit just prior to plasma processing through a plane indicated by line A in FIG. 1.

Referring to FIG. 2, although the polysilicon gate 16 appears to terminate over active silicon 18, it must be remembered that FIG. 2 is a cross-sectional view of the IC 10 and is intended to emphasize the topography of active and gate contact holes. The view shown in FIG. 2 corresponds to a cut through FIG. 1 at a position indicated by line A on FIG. 1. The polysilicon line 14 in FIG. 2 actually extends into or out of page, such that it does not terminate directly over the active silicon 18.

The polysilicon line 14 is deposited over a thin oxide layer 15 that separates the active silicon 18 and the polysilicon line 14. The oxide layer 15 thus forms a thin junction layer (typically 4 to 12 nanometers thick) between the gate 16 and the active silicon 18. A layer of pre-metal dielectric (PMD) 26 is deposited over the gate 16 and the source/drain 20. Above the PMD layer 26 a layer of photoresist 32 is applied in which a pattern of contact holes 30 is defined by photolithography.

Still referring to FIG. 2, a pre-metal dielectric (PMD) layer 26 is deposited over the active silicon 18 and the polysilicon line 14. The PMD layer 26 serves as an insulator to isolate the gate 16, source/drain 20, and other electrically conductive components of the IC 10 from each other and from subsequently defined interconnect metal layers. The PMD layer 26 can be deposited in a series of multiple individual layers that may be composed of different materials. Desirable properties of materials used in the PMD layer include lack of contamination and defects, a low dielectric constant, a high resistivity to electric field breakdown, a high etch selectivity relative to the underlying materials, the ability to cover topology on the surface of the wafer, a high barrier to ionic contaminants, and good adhesion to the underlying and overlying layers. Materials suitable for the PMD layer may include silicon dioxide ($SiO_2$), phosphosilicate glass (PSG), and borosilicate glass (BSG). $SiO_2$ can be deposited using chemical vapor deposition (CVD), in which case tetraethoxysilane (also known as tetraethylorthosilicate or TEOS) gas is flowed over the IC wafer that is maintained at a temperature of 650–750° C. Alternatively, silane ($SiH_4$) may be oxydized at low pressure and temperature (400–500° C.) to produce a layer of $SiO_2$. The deposition rate can be increased and the temperature can be reduced by plasma-assisted CVD (PECVD). Dopants such as arsenic, phosphorous, boron or flourine may be added to the gases during CVD to alter the material properties of the resulting oxide. Boron, flourine, and phosphorous dopants can be used in concentrations ranging from 0 to 6% in the wafers of the inventions. Typically the PMD layer consists of an undoped CVD TEOS oxide as its bottom most layer with a phosphorous (or boron and phosphorous) doped CVD TEOS oxide layer above this and an optional PECVD oxide as the top most layer. The bottom most undoped layer prevents the dopants in the subsequent layers from affecting the doping of the active or polysilicon circuit elements. The phosphorous doped layer traps mobile ion contamination (primarily sodium and potassium ions). Phosphorous and boron also lower the melting point of the oxide, which may be useful in thermal flow planarization schemes. The optional topmost PECVD layer can be deposited rapidly and provides uniform polishing properties for subsequent CMP operations. The top surface 28 of the PMD layer 26 is typically smooth and planarized. Planarization of the entire PMD layer over the wafer can be accomplished through chemical-mechanical polishing (CMP), which uses a combination of chemical and mechanical effects to achieve a local smoothness over a single transistor of about ±10 nanometers and a global smoothness over the entire wafer of about ±200 nanometers.

FIG. 2 shows the pattern of contact holes 30 in the photoresist 32 just prior to plasma processing. After the wafer has been dehydrated, a thin layer of material, commonly hexamethyldisilazane (HMDS), is deposited on the planarized PMD surface layer 28 to promote adhesion between the PMD 26 and photoresist 32. The photoresist 32 may have an initial thickness 34 of about 0.5–1.2 microns and a variation across the wafer surface of less than about 20 nanometers. Contact holes 30 are created in the photoresist is layer 32 by using well-known lithographic (exposure) and wet chemical etching (development) techniques to transfer a predetermined pattern into the photoresist 32. A gate contact hole 34 over a polysilicon line 14 has a width W1, and a neighboring active contact hole 38 over active silicon 18 has a width W2. Both the width W1 of the gate contact hole 34 to a polysilicon gate 14 and width W2 of the adjacent active contact hole to active silicon 18 are determined by a pattern present in a physical mask which is transferred to the photoresist layer 32 during the lithography process. Features in the physical mask corresponding to different widths W1 and W2 may be achieved through automated pattern generation design methods. Such automated methods may use Boolean logic to combine circuit design patterns for different kinds of contacts into a single physical mask pattern. A circuit designer may develop different circuit patterns for different kinds of circuit elements, e.g. gate or active elements of transistors, or top- or bottom-plates of capacitors; and each such circuit pattern may use a different, constant width for the circuit elements it is concerned with. Boolean logic may then be used to combine the circuit element patterns with the pattern of the contact design pattern in order to create a physical mask with a pattern that may be used to create differently sized contact holes in the photoresist. Thus, a contact design pattern composed of identically sized holes at the circuit design level may be subdivided into two or more subpatterns of differently sized holes at the physical mask level. This may be used to distinguish capacitor contacts from gate contacts from active contacts and to size each differently on the physical mask, using a mask writing tool, even though the initial contact design pattern data may use one size for all three types of contacts. Boolean logic methods are useful because the resolution of features created during the writing of the mask may be finer than the resolution of features created in the circuit design stage.

Figure 3:
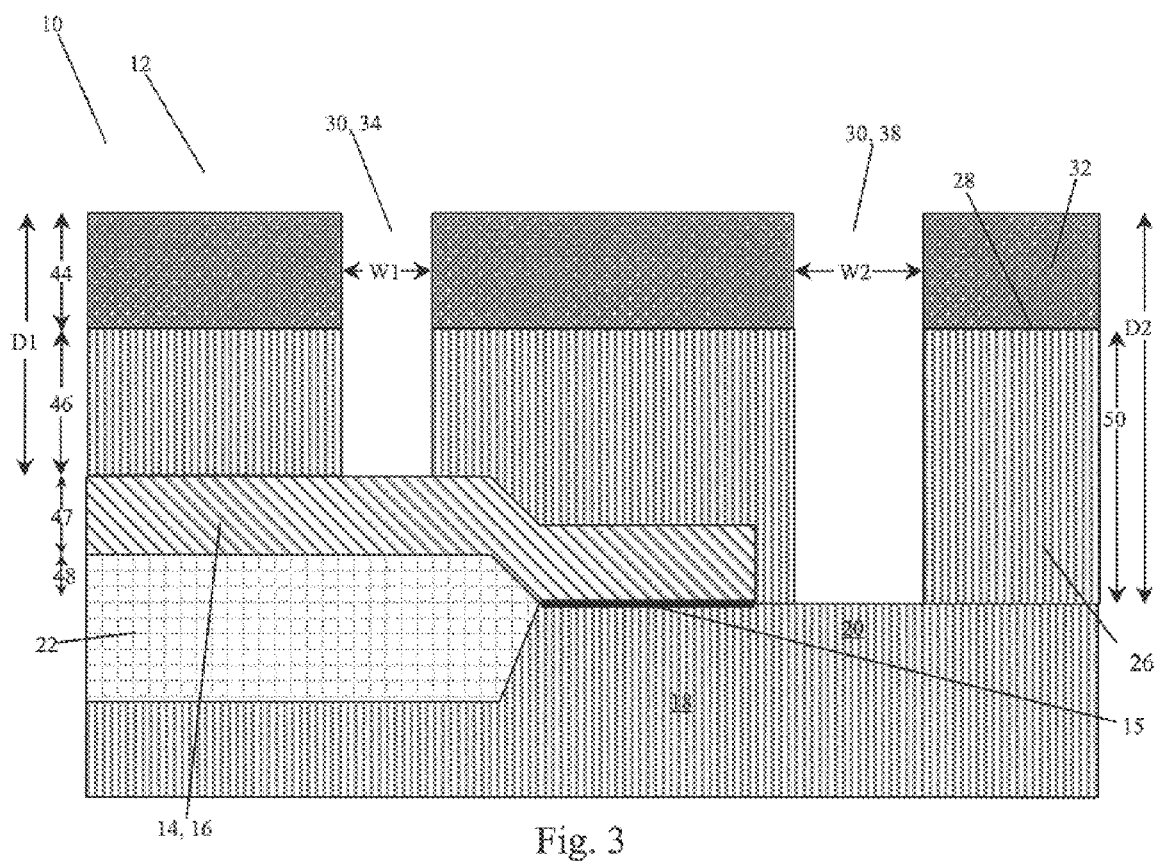
FIG. 3 is a cross-sectional view of the integrated circuit just subsequent to plasma processing through a plane indicated by line A in FIG. 1.

Referring to FIG. 3, the contact holes 30 created in the photoresist layer 32 are deepened using plasma processing to selectively remove the portions of PDM 26 which are below the planarized PMD surface layer 28 and above the polysilicon line 14 and above the active silicon 18. The plasma may be created by ionizing a low pressure (1–250 millitorr) gas typically consisting of a mixture of $CF_4$, $CHF_3$, Ar, $O_2$, CO, $CO_2$, $C_2F_6$, $C_4F_8$, $N_2$ or some subset of these gases and typically using a 13.56 or 27.12 megahertz RF electromagnetic field. The plasma attacks the exposed surfaces of the IC wafer 10 and etches the exposed material. The wafer is placed on an insulator covered conducting surface which is typically RF biased to a time average negative potential of approximately −100 to −700 volts relative to the plasma potential, thus directing the positive ions of the plasma into the wafer surface. The potential drop occurs almost entirely within the sheath of the plasma, located within a few millimeters of the wafer surface. Because the mean free path of ions in the plasma is on the order of 0.5 to 50 millimeters the ions make their last collision before hitting the surface of the wafer far from the wafer and, therefore, acquire a significant kinetic energy as they accelerate toward the wafer surface. If they enter a contact hole 30, they do so in a direction nearly perpendicular to the surface of the wafer 10. Because of is the high energy and directionality of the positive ions, the contact holes 30 are deepened primarily in the vertical direction with very little erosion of the sidewalls of the contact holes. By carefully choosing the plasma conditions, the PMD oxide layer 26 can be etched much more rapidly than either the photoresist 32, the polysilicon gate 16, or the active silicon 18. The electrons in the plasma drift at a much higher velocity than the ions, due to their smaller mass, and are much less directional than the ions. Once per RF cycle they approach the wafer surface and near the wafer surface they are approximated by an isotropic half Maxwell-Boltzmann distribution with an electron temperature of a few electron volts. Thus, the ions and electrons are shadowed differently as they enter the contact holes 30. Because of the ions' higher directionality, a positive potential builds up at the bottom of the contact holes 30 until the resulting local micro-electric fields overcome the random thermal energy of the electrons and equalize the electron and ion fluxes on a point by point basis. The resulting potential scales with the aspect ratio of the contact hole 30, and may reach tens to hundreds of volts.

Further referring to FIG. 3, if a difference exists between the aspect ratio of an active contact hole 38 and an adjacent gate contact hole 34, then a corresponding potential difference will be imposed across the gate oxide 15. The depth of active 38 and gate 34 contact holes is different in nearly every IC device. In particular, the depth D2 of active contact holes 38 is equal to the depth of the gate contact hole 34 plus the thickness 47 of the polysilicon gate electrode 14 plus the height difference 48 between field oxide 22 and active silicon 18 for the typical case where gate electrodes 14 are placed over field oxide 22 as shown in FIG. 2. Any potential difference between adjacent gate 34 and active 38 contact holes may result in an electric field that may cause a current to tunnel through the thin gate oxide layer 15 during plasma processing.

Still referring to FIG. 3, after plasma processing, the gate contact hole 34 over the polysilicon line 14 has a depth D1 equal to the thickness 44 of the photoresist layer after plasma processing plus the thickness 46 of the PMD above the polysilicon line 14. The active contact hole 38 over the active silicon 18 has a depth D2 equal to the thickness 44 of the photoresist layer after plasma processing plus the thickness 50 of the PMD above active silicon 18. The thickness 50 of the PMD above the active silicon 18 is equal to the thickness 46 of the PMD above the polysilicon line 16 plus the thickness 47 of the polysilicon line 16 plus the thickness 48 of the field oxide step, i.e. the height of the field oxide 22 above the active silicon 18. The gate contact hole 34 over the polysilicon gate electrode 16 has an aspect ratio defined by its depth D1 divided by its width W1. The active contact hole 38 over active silicon 18 has an aspect ratio defined by its depth D2 divided by its width W2. The active 38 and gate 34 contact holes are sized such that the aspect ratio of the gate contact hole 34 over the polysilicon gate electrode 14 is substantially equivalent to the aspect ratio of the active contact hole 38. Thus, D1/W1≅D2/W2. According to the invention, a reduction in plasma damage is obtained when D1/W1 is substantially equivalent to and, within about ±10%, of D2/W2. For example, where the field oxide 22 step thickness 48 is 0.05 microns, the polysilicon gate electrode 16 thickness 47 is 0.30 microns, the thickness 46 of CMP planarized PMD 26 above the gate electrode 16 is 0.50 microns, and the thickness 44 of the post-etch photoresist is 0.60 microns, the total depth of the gate contact is 1.10 microns and the depth of the active contact hole is 1.45 microns. For a width W1 of the gate contact hole 34 equal to 0.27 microns and a width W2 or the active contact hole 38 equal to 0.35, the aspect ratio of both the gate 34 and active 38 contact holes is 4.1. Alternatively, the width W1 of the gate contact hole 34 may be 0.35 microns while the width W2 of the active contact hole 38 is 0.46 microns, such that the aspect ratio of both gate 34 and active 38 contact holes is 3.1. With gate 34 and active 38 contact holes having equal aspect ratios the potentials that build up at the bottom of adjacent contact holes 34, 38 is substantially equivalent, such that only very small electric fields are created across the gate oxide 15 and the possibility of gate oxide breakdown or damage is minimized. For simplicity FIGS. 2 and 3 do not show typical transistor features including oxide or nitride side wall spacers, self aligned Ti, Co or Pt silicide layers over the polysilicon and active silicon layers, lightly doped drain regions, threshold adjust implants. The current invention is applicable regardless of the presence or absence of these and other transistor features. In some cases contacts are simultaneously etched to three topologically distinct circuit layers. For example a lower polysilicon layer may be used for transistor gates and for the bottom plate of a capacitor while a second polysilicon layer is used as the upper plate of a capacitor. In this case equalizing the aspect ratio of gate and active contacts will protect the gate oxide from plasma damage during contact etch, while equalizing the aspect ratios of the contacts to the lower and upper plates of the capacitor will protect the capacitor dielectric.

What is claimed is:

1. A method of fabricating contacts to device elements of an integrated circuit on a semiconductor substrate comprising:

using a plasma process to form a first hole in material above a first portion of the device, wherein the first hole has a depth and a width at the end of the plasma process, and wherein the first hole has an aspect ratio at the end of the plasma process defined by its depth divided by its width;

using a plasma process to form a second hole in material above a second portion of the device, adjacent to the first portion, wherein the second hole has a depth and a width at the end of the plasma process, the depth and width of the second hole being different from the depth and width of the first hole, and wherein the second hole has an aspect ratio at the end of the plasma process defined by its depth divided by its width;

and wherein the aspect ratio of the first hole is substantially equivalent to the aspect ratio of the second hole.

2. The method of claim 1 wherein the first portion of the device is the gate of a transistor.

3. The method of claim 1 wherein the second portion of the device is the source or the drain of a transistor.

4. The method of claim 1 wherein the plasma process is plasma etching.

5. The method of claim 1 wherein the material above the first portion of the device comprises at least one of photoresist and a dielectric material.

6. The method of claim 1 wherein the material above the second portion of the device comprises at least one of photoresist and a dielectric material.

7. The method of claim 1 wherein the first portion of the device comprises polysilicon.

8. The method of claim 1 wherein the second portion of the device comprises active silicon.

9. The method of claim 1 wherein the material above the first portion of the device and the material above the second portion of the device are planarized prior to the start of the plasma process.

10. The method of claim 1 wherein the plasma process is terminated after polysilicon is exposed at the bottom of the first hole and after active silicon is exposed at the bottom of the second hole.

11. The method of claim 1 wherein the width of the first hole and the width of the second hole are determined by a lithographic pattern in a photoresist layer on the integrated circuit.

12. The method of claim 11 wherein the lithographic pattern is transferred to the photoresist by a pattern generating mask.

13. The method of claim 12 wherein the pattern generating mask is a photolithography mask.

14. The method of claim 12 wherein the pattern generating mask is an X-ray lithography mask.

15. The method of claim 12 wherein the pattern generating mask is a projection electron-beam lithography mask.

16. The method of claim 12 wherein differently sized features of the pattern generating mask corresponding to the width of the first hole and the width of the second hole are created by using Boolean logic to combine circuit element design patterns with contact design patterns.

17. An apparatus formed in accordance with the method of claim 1.

* * * * *